(12) United States Patent
Chang et al.

(10) Patent No.: US 12,119,040 B2
(45) Date of Patent: *Oct. 15, 2024

(54) MEMORY POWER CONTROL BY ENABLE CIRCUIT

(71) Applicant: Taiwan Semiconductor Manufacturing Company, Ltd., Hsinchu (TW)

(72) Inventors: Zhi-Hao Chang, Yunlin County (TW); Wei-jer Hsieh, Hsinchu (TW); Yangsyu Lin, New Taipei (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 85 days.

This patent is subject to a terminal disclaimer.

(21) Appl. No.: 17/832,186

(22) Filed: Jun. 3, 2022

(65) Prior Publication Data

US 2023/0298657 A1 Sep. 21, 2023

Related U.S. Application Data

(60) Provisional application No. 63/322,045, filed on Mar. 21, 2022.

(51) Int. Cl.
*G11C 11/4074* (2006.01)
*G11C 11/4072* (2006.01)
*G11C 11/4093* (2006.01)

(52) U.S. Cl.
CPC ...... *G11C 11/4074* (2013.01); *G11C 11/4072* (2013.01); *G11C 11/4093* (2013.01)

(58) Field of Classification Search
CPC ............ G11C 11/4074; G11C 11/4072; G11C 11/4093; G11C 11/417; G11C 11/412; G11C 11/413; G11C 5/147; G11C 5/148; G11C 5/143
See application file for complete search history.

(56) References Cited

U.S. PATENT DOCUMENTS

| | | | |
|---|---|---|---|
| 10,014,864 B2 | 7/2018 | Ghosh et al. | |
| 11,057,025 B2 | 7/2021 | Chen et al. | |
| 11,070,208 B2 | 7/2021 | Jain | |
| 2022/0308610 A1* | 9/2022 | Srinivasan | G05F 1/562 |

FOREIGN PATENT DOCUMENTS

| | | |
|---|---|---|
| CN | 108305647 B | 9/2020 |
| EP | 3 283 937 B1 | 1/2019 |
| KR | 10-2011-0111477 A | 10/2011 |
| KR | 10-2019-0010437 A | 1/2019 |

* cited by examiner

*Primary Examiner* — Sultana Begum
(74) *Attorney, Agent, or Firm* — MERCHANT & GOULD P.C.

(57) ABSTRACT

A power control device includes a first switch and a second switch. A first terminal of the first switch is configured to receive a first voltage signal in a first voltage domain, and a first terminal of the second switch is configured to receive a second voltage signal in a second voltage domain different from the a first voltage domain. A second terminal of the second switch is coupled to a second terminal of the first switch, and a control circuit is coupled to control terminals of the first switch and the second switch. The control circuit is configured to turn on the first switch in response to a decrease of a voltage level of the first voltage signal.

20 Claims, 18 Drawing Sheets

| (AON_SELSRAM_IN=1\|0) | Enable | SD | VDD | VDDM | GMB | GDB | GDB2 |
|---|---|---|---|---|---|---|---|
| SD mode (VDD Non-Collapsed) | 0 | 1 | 1 | 1 | 1 (VDDM) | 1 (VDDM) | 1 (VDDM) |
| X-rail reduction mode (VDD Collapsed) | 1 | 1 | 0 | 1 | 1 (VDDM) | 1 (VDDM) | 0 |

| (AON_SELSRAM_IN=1\|0) | Enable | SD | VDD | VDDM | GMB | GDB |
|---|---|---|---|---|---|---|
| SD mode<br>(VDD Non-Collapsed) | 0 | 1 | 1 | 1 | 1<br>(VDDM) | 1<br>(VDDM) |
| X-rail reduction mode<br>(VDD Collapsed) | 1 | 1 | 0 | 1 | 1<br>(VDDM) | 0 |

FIG. 8

| (AON_SELSRAM_IN=1\|0) | Enable | SD | VDD | VDDM | GMB | GDB |
|---|---|---|---|---|---|---|
| SD mode (VDDM Non-Collapsed) | 0 | 1 | 1 | 1 | 1 (VDDM) | 1 (VDDM) |
| X-rail reduction mode (VDDM Collapsed) | 1 | 1 | 1 | 0 | 0 | 1 (VDDM) |

FIG. 11

| (AON_SELSRAM_IN=1 \| 0) | Enable | SD | VDD | VDDM | GMB | GDB | GDB2 |
|---|---|---|---|---|---|---|---|
| SD mode (VDD Non-Collapsed) | 0 | 1 | 1 | 1 | 1 (VDDM) | 1 (VDDM) | 1 (VDDM) |
| X-rail reduction mode (VDD Collapsed) | 1 | 1 | 0 | 1 | 1 (VDDM) | 1 (VDDM) | 0 |

FIG. 14

| (AON_SELSRAM_IN=1 \| 0) | Enable | SD | VDD | VDDM | GMB | GDB | GMB2 |
|---|---|---|---|---|---|---|---|
| SD mode (VDDM Non-Collapsed) | 0 | 1 | 1 | 1 | 1 (VDDM) | 1 (VDDM) | 1 (VDDM) |
| X-rail reduction mode (VDDM Collapsed) | 1 | 1 | 1 | 0 | 1 (VDDM) | 1 (VDDM) | 0 |

FIG. 17

MEMORY POWER CONTROL BY ENABLE CIRCUIT

CROSS-REFERENCE TO RELATED APPLICATIONS

This application claims the benefit of U.S. Provisional Application No. 63/322,045, filed on Mar. 21, 2022, entitled "Memory Power Control," which is incorporated by reference in its entirety.

BACKGROUND

Some known memory devices, such as a static random access memory (SRAM) device, include a power switch control design. A typical SRAM memory device has an array of memory cells. Each memory cell uses an arrangement of transistors connected between an upper reference potential and a lower reference potential (typically ground) such that one of two storage nodes can be occupied by the information to be stored, with the complementary information stored at the other storage node. Some SRAM arrangements operate the memory logic in a low voltage domain, while the memory array is operated in a high voltage domain. Further, various techniques may be employed to reduce power consumption. For example, portions of the memory device may be turned off during a sleep, or shutdown mode. A power switching arrangement is provided to switch between the different voltage domains, and also to implement the different operational modes such as shutdown mode.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 8 is a table illustrating logic values for various signals corresponding to the power switch control circuit illustrated in FIG. 5 in accordance with some embodiments.

FIG. 11 is a table illustrating logic values for various signals corresponding to the power switch control circuit illustrated in FIG. 9 in accordance with some embodiments.

FIG. 14 is a table illustrating logic values for various signals corresponding to the power switch control circuit illustrated in FIG. 13 in accordance with some embodiments.

FIG. 17 is a table illustrating logic values for various signals corresponding to the power switch control circuit illustrated in FIG. 16 in accordance with some embodiments.

DETAILED DESCRIPTION

Figure 1:
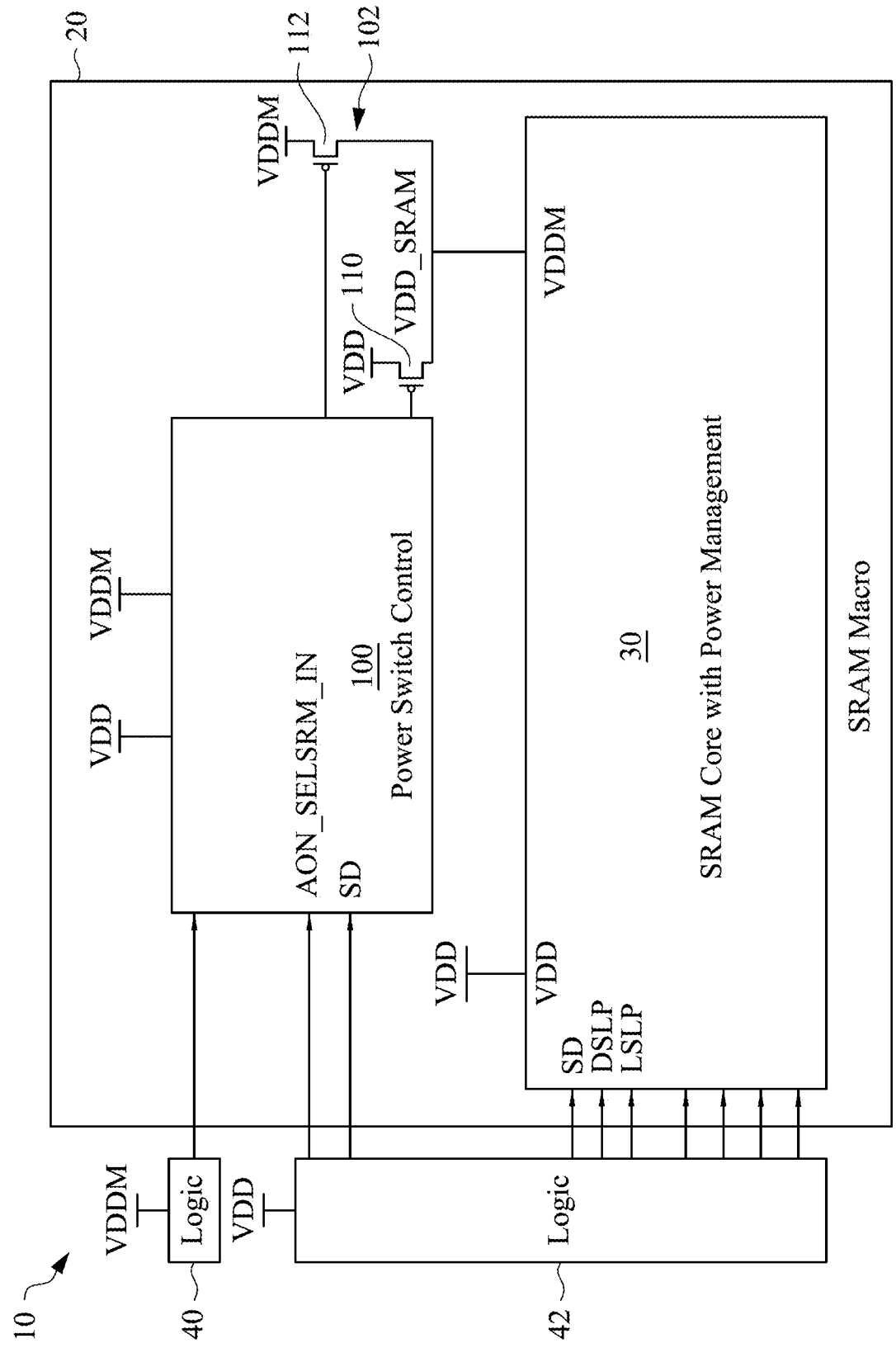
FIG. 1 is a block diagram illustrating an example of a memory device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some memory devices, such as a static random access memory (SRAM) device, include a power switch control circuit. A typical SRAM memory device has an array of memory cells. An example SRAM arrangement has memory cells that each use six transistors connected between an upper reference potential and a lower reference potential (typically ground) such that one of two storage nodes can be occupied by the information to be stored, with the complementary information stored at the other storage node. Some SRAM arrangements operate the memory logic in a low voltage domain, while the memory array is operated in the high voltage domain. Further, various techniques may be employed to reduce power consumption. For example, portions of the memory device may be turned off during a sleep, or shutdown (SD) mode. Problems can arise if switching procedures are not carefully controlled.

In some implementations, a power switch circuit is configured to select between power rails for different power domains, such as VDD and VDDM. Thus, the control circuit may be configured to select VDD or VDDM under a dual power scheme. The control circuit may include power switches, such as CMOS transistors, that are responsive to respective control signals for the VDDM and VDD domains.

FIG. 1 shows an example electronic device, such as an SRAM memory device 10 in accordance with some embodiments. As shown in FIG. 1, the example SRAM device 10 includes an SRAM macro 20 that includes an SRAM core 30 and a power switch control circuit 100.

The SRAM device 10 is configured to operate in two different power domains. The illustrated example SRAM device 10 thus includes voltage input terminals corresponding to the two voltage domains: VDD input terminals configured to receive a VDD input voltage for the VDD power domain, and VDDM input terminals configured to receive a VDDM input voltage for the VDDM power domain. The SRAM macro 20 further includes a power switch control circuit 100 configured to selectively control output of the VDD and/or VDDM voltage signal to the SRAM core 30.

Logic circuits 40 and 42 provide control signals to the SRAM core 30 and/or power switch circuit 100 in the VDDM and VDD voltage domains, respectively. For example, one or both of the logic circuits 40, 42 may output sleep and shutdown signals to components of the SRAM macro 20. In some embodiments, the logic circuits 40, 42 may output deep sleep (DSLP), light sleep (LSLP), and/or shutdown (SD) control signals. In the LSLP and DSLP modes, the memory array may continue to receive power while different combinations of periphery components are shut down, while in the shutdown mode power may be removed from both the periphery items and the memory array.

In the illustrated example, the power switch control circuit 100 outputs control signals to a header circuit 102 that controls power switches 110 and 112 to selectively output a power signal VDD_SRAM to the SRAM core 30. In the example of FIG. 1, the power switches are implemented by p-type metal-oxide semiconductor (PMOS) transistors. Thus, in a memory operation mode, the control circuit 100 controls the power switches 110, 112 of the header circuit 102 to connect the VDD or VDDM terminal to output the VDD_SRAM signal to the SRAM core 30 in the desired VDD or VDDM power domain. FIG. 1 illustrates the control circuit 100 and header circuit connected to the SRAM core 30, though the disclosure is not limited to SRAM memory. The control circuit 100 may be employed, for example, with other types of memory or other devices that are powered using different power domains.

Figure 2:
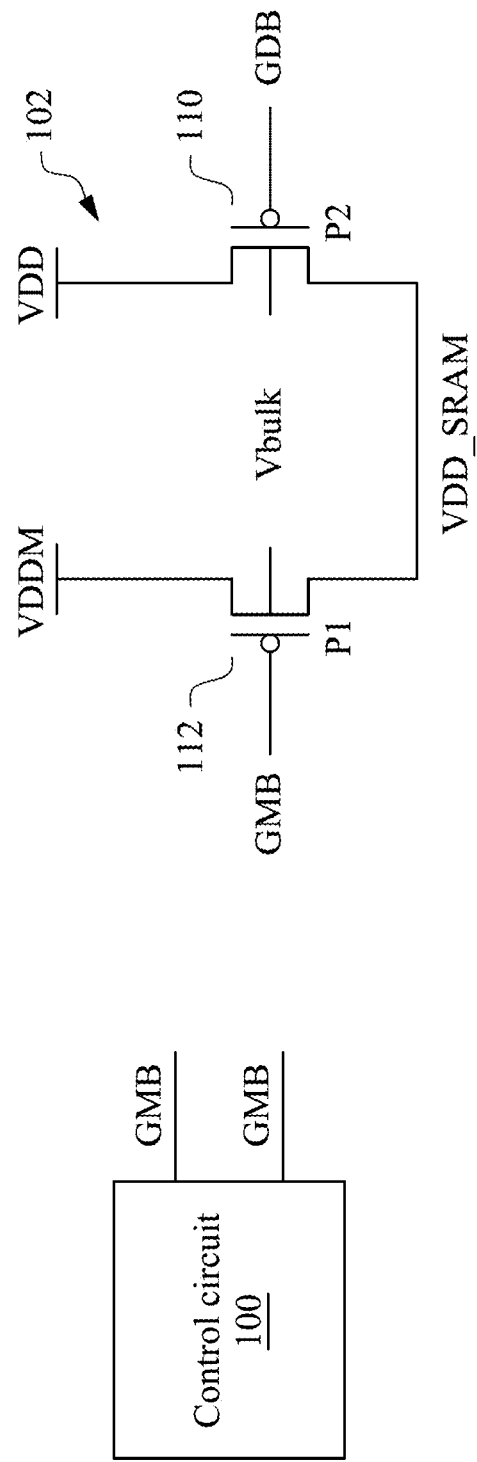
FIG. 2 is a schematic diagram illustrating a header circuit and control circuit in accordance with some embodiments.

FIG. 2 illustrates further aspects of the control circuit 100 and header circuit 102. The power switch control circuit 100 is configured to output gate control signals GMB and GDB to gate terminals of the switches 110 and 112, respectively. The switch 110 has one source/drain terminal connected to the VDD input terminal and its other source/drain terminal connected to the output terminal VDD_SRAM. As such, the switch 110 is sometimes referred to herein as the "VDD control switch 110." The switch 112 has one source/drain terminal connected to the VDDM input terminal and its other source/drain terminal connected to the output terminal VDD_SRAM. As such, the second switch 112 is sometimes referred to herein as the "VDDM control switch 112."

In the shutdown mode, for example, logic high (i.e. logic 1) gate control signals GMB and GDB would be applied to the gate terminals of the power switches 110 and 112 to turn off both switches, disconnecting the SRAM core 30 from the VDDM and VDD input terminals. In other implementations, the power switches could be implemented by n-type metal-oxide semiconductor (NMOS) transistors, in which case the control signals would be opposite. Moreover, in other implementations other types of control switches may be employed.

Thus, in the shutdown mode, both gate control signals GMB and GDB are forced to a predetermined level (e.g. logic 1 for the PMOS transistors) to turn off both power switches 110, 112 and reduce leakage. However, in some instances there can be a leakage path created by Gate-Induced-Drain-Leakage (GIDL) when, for example, the VDD voltage signal is collapsed (i.e. decreases to 0) during the shutdown mode. The collapsed VDD and high GDB gate signal (i.e. VDD control signal) form a negative bias level on the VDD control switch 110, which in turn can induce the GIDL leakage. The GIDL leakage is proportional to the negative bias level since more tunneling of valence band electron-hole pairs into the conduction band are created under a larger electric filed.

In accordance with some embodiments, an extra pin is provided to force the appropriate control signal GMB and/or GDB for the PMOS power control switch(es) 110, 112 from 1 to 0 after the VDD and/or VDDM input voltage collapses, such as due to being turned off during the shutdown mode for energy savings. In other words, the appropriate switch 110, 112 is turned on in response to collapse of VDD or VDDM. The bulk to source leakage is thus reduced (12% reduction in some examples), and the channel leakage increases. In examples where the control switches are implemented by PMOS transistors, the total leakage savings may be about 51% and 38%, respectively. Accordingly, as used herein the "X-rail reduction mode" refers to operation of the control circuit 100 to control the switches 110 and/or 112 when the VDD and/or VDDM voltage collapses.

Figure 3:
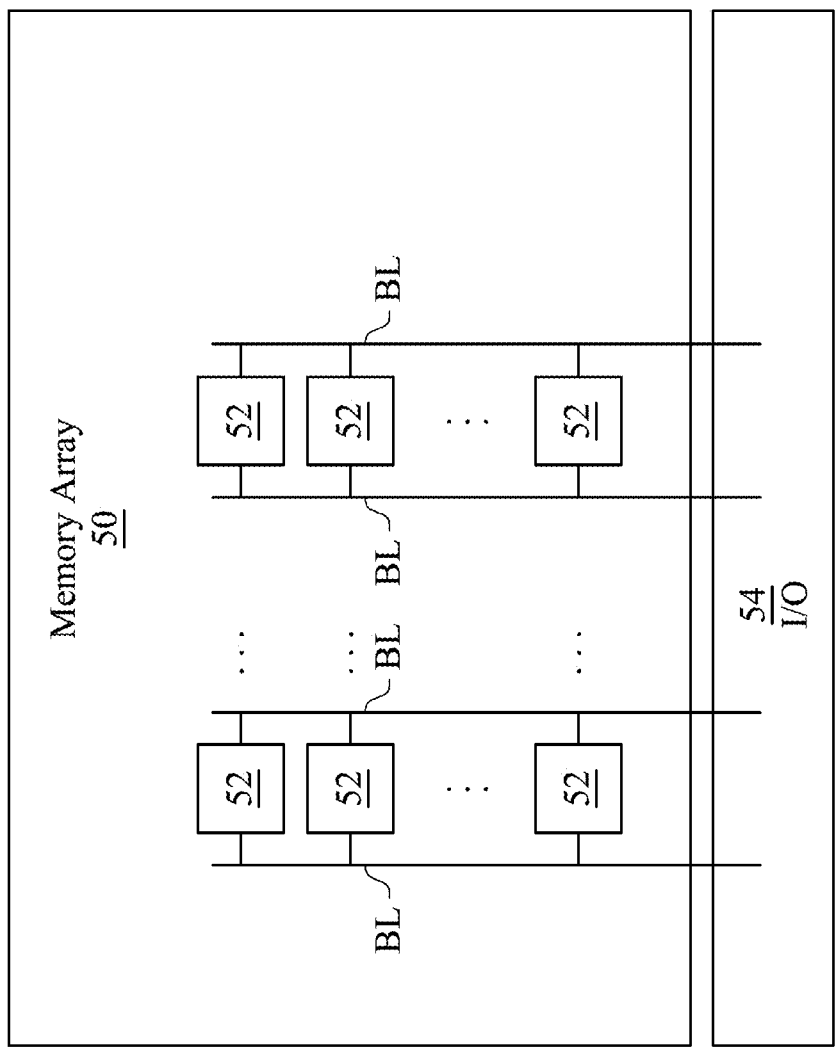
FIG. 3 is a block diagram illustrating an example of a memory array in accordance with some embodiments.

The SRAM core 30 includes one or more memory arrays 50, which include a plurality of memory cells 52, or bit-cells. FIG. 3 illustrates an example of one of the memory arrays 50. The SRAM core 30 also includes an input/output (I/O) circuit 54 that is connected to the logic circuit 42. The memory cells 52 and I/O 54 may be coupled by complementary bit lines BL and BLB, and data can be read from and written to the memory cells 52 via the complementary bit lines BL and BLB. In the example of FIG. 3, the memory cells 52 are SRAM cells. However, the disclosure is not limited to SRAM memory.

Figure 4:
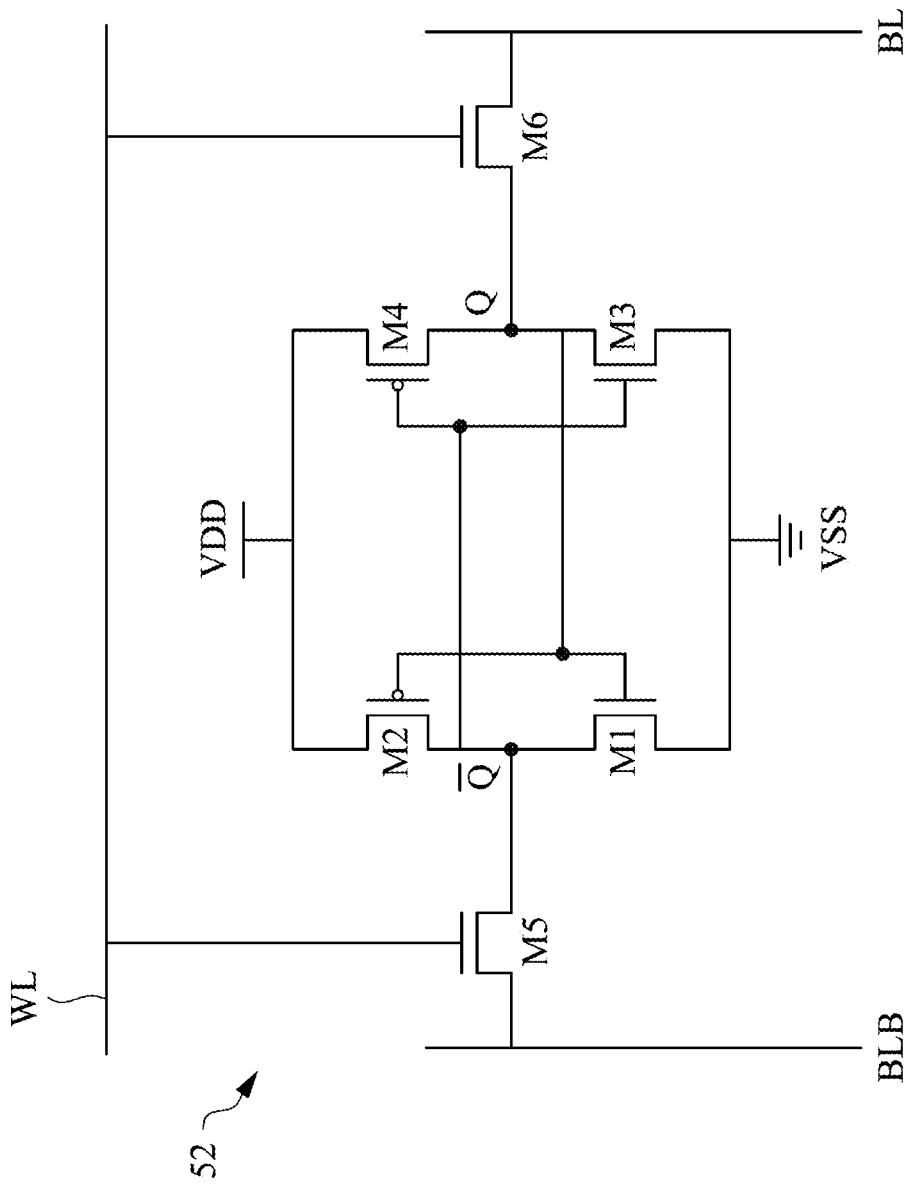
FIG. 4 is a schematic diagram illustrating an example of an SRAM memory cell of the memory array shown in FIG. 3 in accordance with some embodiments.

FIG. 4 is a circuit diagram illustrating an example SRAM memory cell 52 in accordance with some embodiments. The memory cell 52 includes but is not limited to a six-transistor (6T) SRAM structure. In some embodiments more or fewer than six transistors may be used to implement the memory cell 52. For example, the memory cell 52 in some embodiments may use a 4T, 8T or 10T SRAM structure, and in other embodiments may include a memory-like bit-cell or a building unit. The memory cell 52 includes a first inverter formed by a NMOS/PMOS transistor pair M1 and M2, a second inverter formed by a NMOS/PMOS transistor pair M3 and M4, and access transistors/pass gates M5 and M6. Transistors M1, M3, M5 and M6 include n-type metal-oxidesemiconductor (NMOS) transistors, and transistors M2 and M4 include p-type metal-oxide semiconductor (PMOS) transistors.

The first and second inverters are cross coupled to each other to form a latching circuit for data storage. A first terminal of each of transistors M2 and M4 is coupled to a power supply VDD, while a first terminal of each of transistors M1 and M3 is coupled to a reference Voltage VSS, for example, ground. A gate of the pass gate transistor M6 is coupled to a word line WL. A drain of the pass gate transistor M6 is coupled to a bit line BL. Moreover, a first terminal of the pass gate transistor M6 is coupled to second terminals of transistors M4 and M3 and also to gates of M2 and M1 at the node Q. Similarly, a gate of the pass gate transistor M5 is coupled to the word line WL. A drain of the pass gate transistor M5 is coupled to a complementary bit line BLB. Moreover, a first terminal of the pass gate transistor M5 is coupled to second terminals of transistors M2 and M1 and also to gates of transistors M4 and M3 at the node Qbar.

Figure 5:
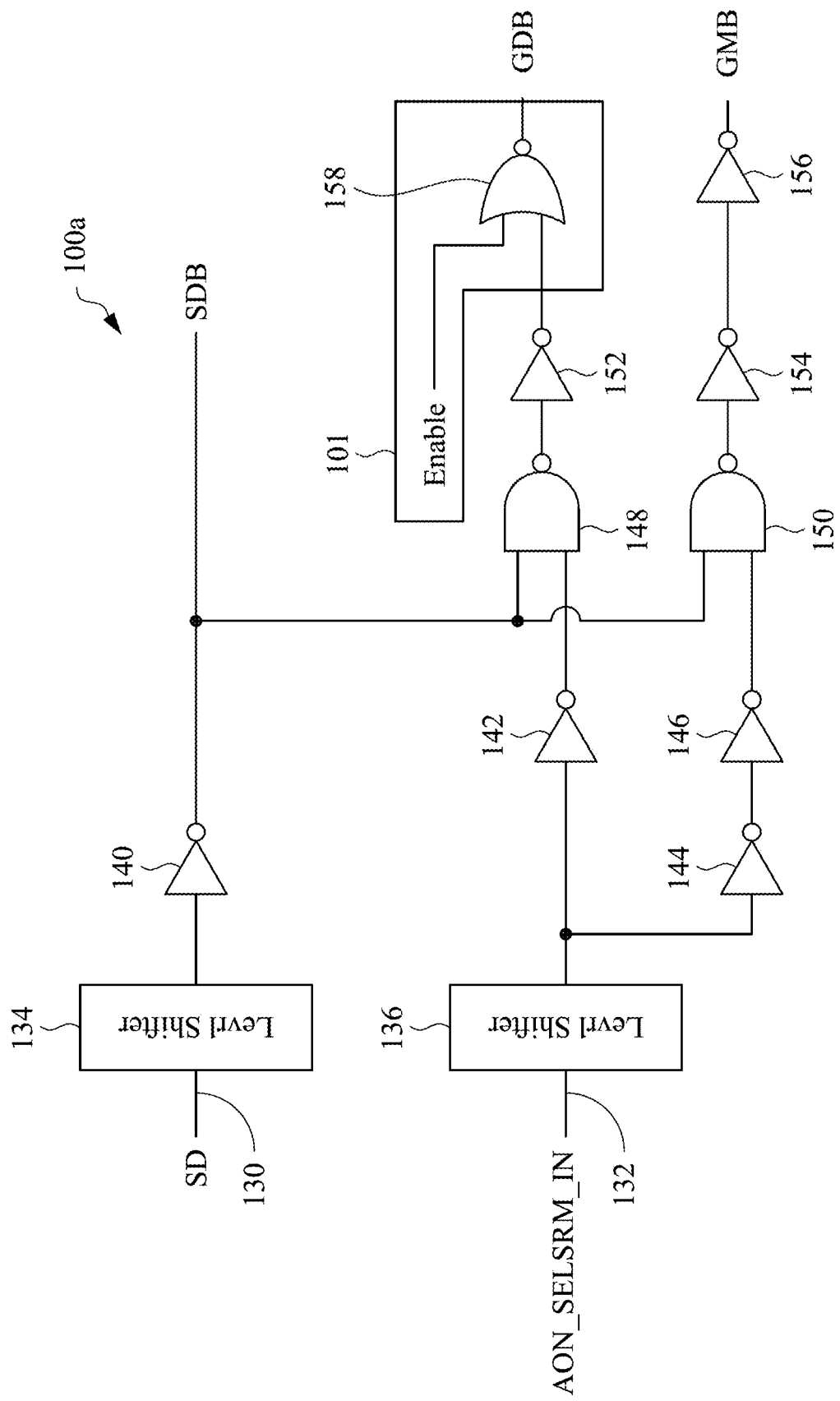
FIG. 5 is a schematic diagram illustrating an example of a power switch control circuit in accordance with some embodiments.

FIG. 5 is a schematic diagram illustrating aspects of an embodiment 100a of the control circuit 100. The control circuit 100a includes an enable pin or terminal that receives an enable signal 101. As noted above, the control circuit 100 outputs gate control signals GDB and GMB to the gate terminals of the switches 110, 112 to selectively turn on one or both of the switches 110, 112 in response to a collapse, or decrease, of a voltage level of the VDDM and/or VDD voltage signal. The enable signal 101 is responsive to the voltage level of VDD and/or VDDM signal. In the example shown in FIG. 5, the control circuit 100a is configured to turn on the VDD control switch 110 in response to a collapse of the VDD voltage. As discussed in further detail below, when the enable signal 101 indicates the collapse of the VDD signal, the GDB control signal goes low to turn on the VDD control switch 110 and reduce the bulk source of the VDD control switch 110.

Figure 6:
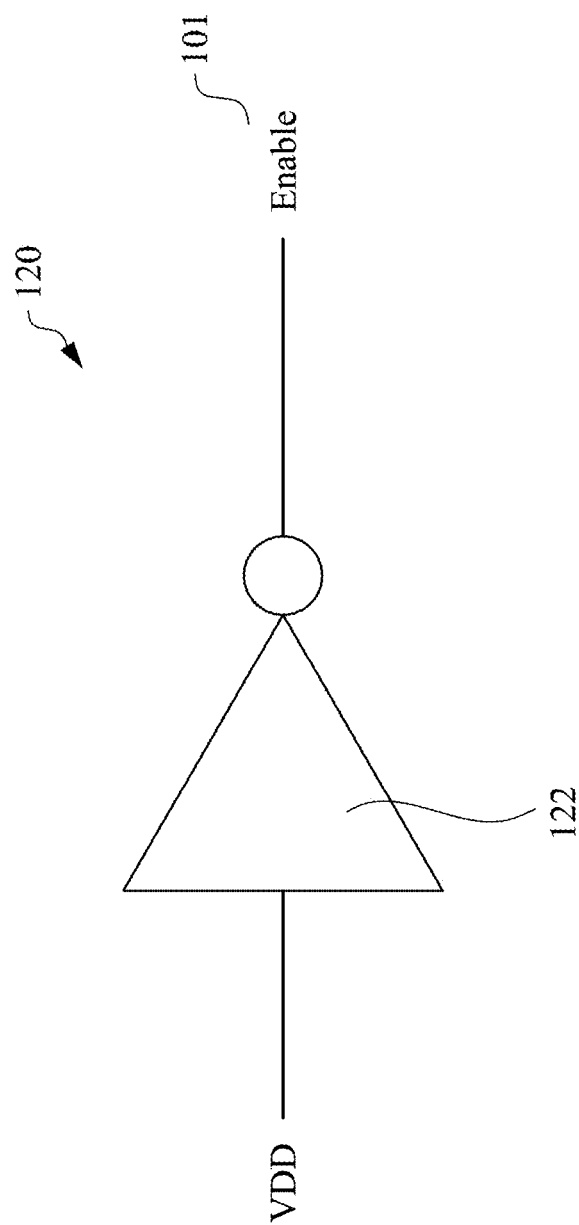
FIG. 6 is a schematic diagram illustrating an example of an enable circuit in accordance with some embodiments.

FIG. 6 illustrates an example of an enable circuit 120 configured to output the enable signal 101 received by the control circuit 100a. The control circuit 100 is configured to turn on the VDD control switch 110 in response to a collapse of the VDD voltage signal. In the illustrated example, the switches 110 and 112 are PMOS transistors, which are turned on based on an active low signal at their gate terminals. Thus, the enable circuit 120 includes an inverter 122 having its input terminal connected to the VDD voltage terminal. When the VDD signal collapses (i.e. goes to 0) the inverter 122 outputs a high enable signal 101.

Returning to FIG. 5, the illustrated control circuit 100a includes a first input terminal 130 configured to receive a shutdown signal SD, and a second input terminal 132 configured to receive an SRAM select signal AON_SELSRM_IN. The control circuit 100 includes a first level shifter 134 and a second level shifter 136 that receive the shutdown signal SD and the SRAM select signal AON_SELSRAM_IN, respectively. The first and second level shifters 134, 136 shift the voltage level of the respective input signals. For example, the first and second level shifters 134, 136 may receive the respective input signals in the VDD voltage domain and output these signals in the VDDM voltage domain. The output of the first level shifter 134 is connected to an inverter 140, which outputs the inverted shutdown signal SD as a shutdown bar signal SDB. The level shifted SRAM select signal AON_SELSRAM_IN is output to inverters 142 and 144. The output of the inverter 144 is received by a further inverter 146.

The outputs of the inverters 142 and 146 are respectively received by NAND gates 148 and 150, along with the shutdown bar signal SDB. The output of the NAND gate 150 is received by inverters 154 and 156 and the inverter 156 outputs the control signal GMB that is received at the gate terminal of the VDDM control switch 112. An inverter 152 receives the output of the NAND gate 148, and provides an input signal to a NOR gate 158. The NOR gate 158 also receives the enable signal 101, and outputs the control signal GDB to the VDD control switch 110. In addition to facilitating the appropriate logic outputs, the inverters shown in FIG. 5 provide the desired signal timing and accordingly, more or fewer inverters may be employed to achieve proper timing of the output signals.

Figure 7:
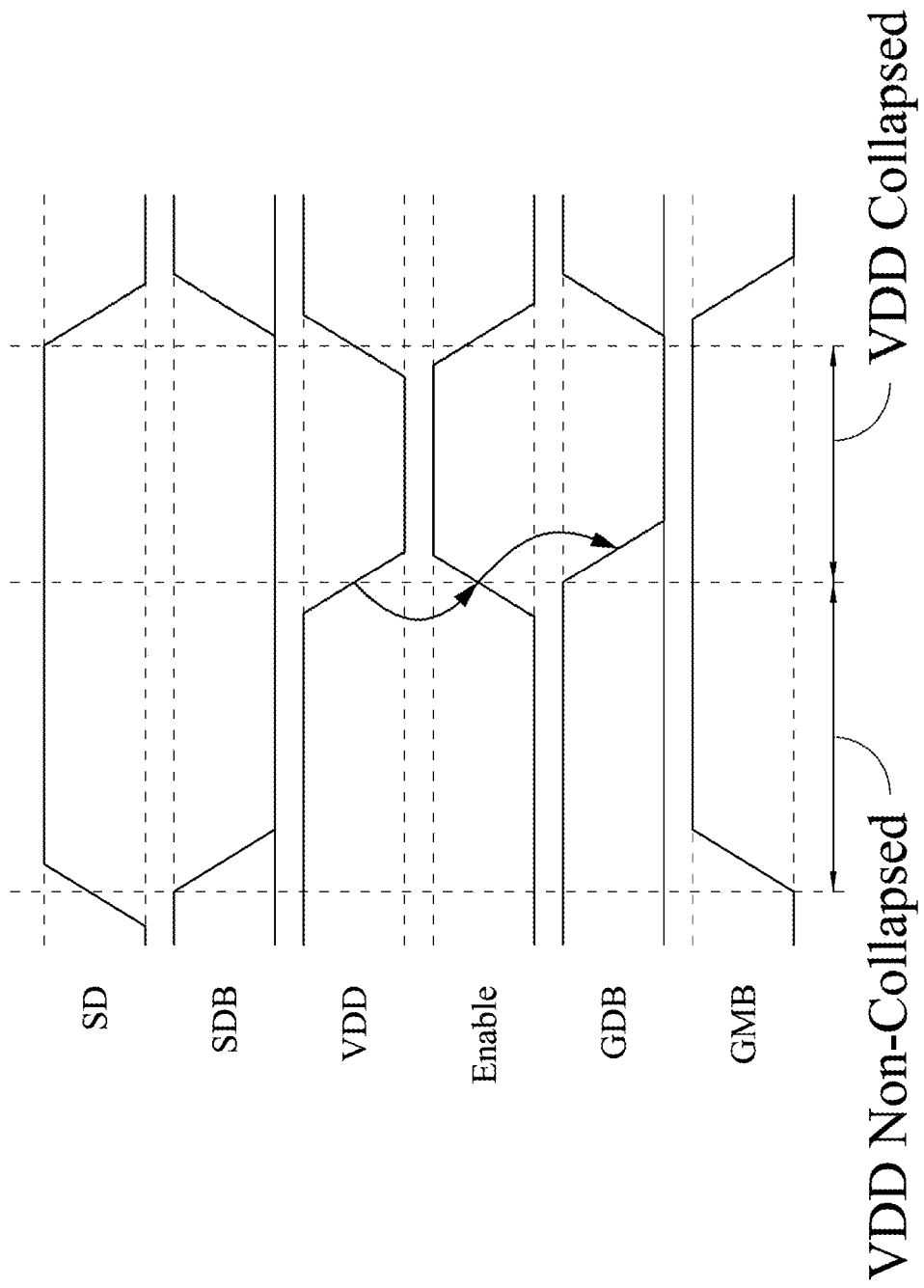
FIG. 7 is a waveform diagram illustrating example waveforms corresponding to the power switch control circuit illustrated in FIG. 5 in accordance with some embodiments.

FIG. 7 is a chart illustrating waveforms for the various signals discussed in conjunction with FIG. 5 and FIG. 8 is a table illustrating logic values for certain ones of the corresponding signals. In a memory mode in which the SRAM core 30 receives power from the header circuit 102 to operate the memory array 50, the shutdown signal is at a low logic level. When the shutdown signal SD goes high to signal the shutdown mode, the inverter 140 outputs a low shut down bar SDB signal. The low SDB signal results in high outputs from the NAND gates 148 and 150. The high output of the NAND gate 150 results in a high GMB signal, which turns off the VDDM control switch 112 and disconnects the VDDM input terminal from the SRAM core 30 during the shutdown mode.

The high output of the NAND gate 148 is output to the inverter 152, which provides a low input to the NOR gate 158. Prior to collapse of the VDD signal, the enable signal 101 remains low. Thus, prior to collapse of the VDD signal, the NOR gate 158 outputs a high GDB control signal to the VDD control switch 110, turning the VDD control switch 110 off to disconnect the VDD input terminal from the SRAM core 30 during the shutdown mode.

When the VDD signal collapses (i.e. reduces to 0 or logic low), the inverter 122 of the enable circuit 120 outputs a high enable signal 101, signaling the X-rail reduction mode. The high enable signal 101 received by the NOR gate 158 causes the GDB control signal to go low. This turns on the VDD control switch 110, reducing the bulk to source leakage.

Figure 9:
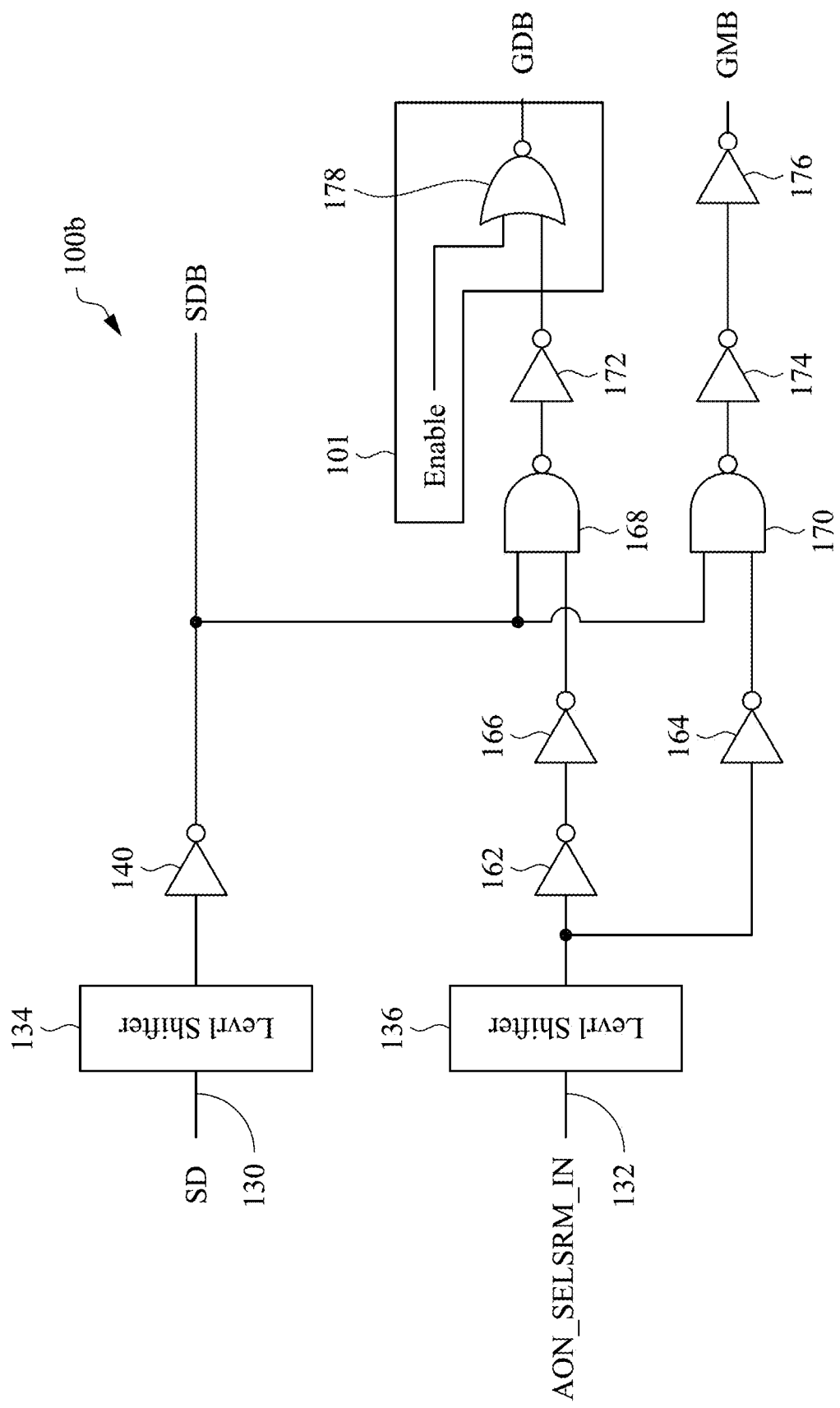
FIG. 9 is a schematic diagram illustrating another example of a power switch control circuit in accordance with some embodiments.

FIG. 9 is a schematic diagram illustrating aspects of another embodiment 100b of the control circuit 100. The control circuit 100a shown in FIG. 5 is configured to turn on the VDD control switch 110 after collapse of the VDD voltage, while the control circuit 100b shown in FIG. 9 turns on the VDDM control switch 112 in response to collapse of the VDDM voltage during the shutdown mode. Thus, in the example shown in FIG. 9, the enable signal 101 is responsive to collapse of the VDDM voltage. Accordingly, when the enable signal 101 indicates the collapse of the VDDM signal, the GMB control signal goes low to turn on the VDDM control switch 112 and reduce the bulk to source leakage of the VDDM control switch 112.

Figure 10:
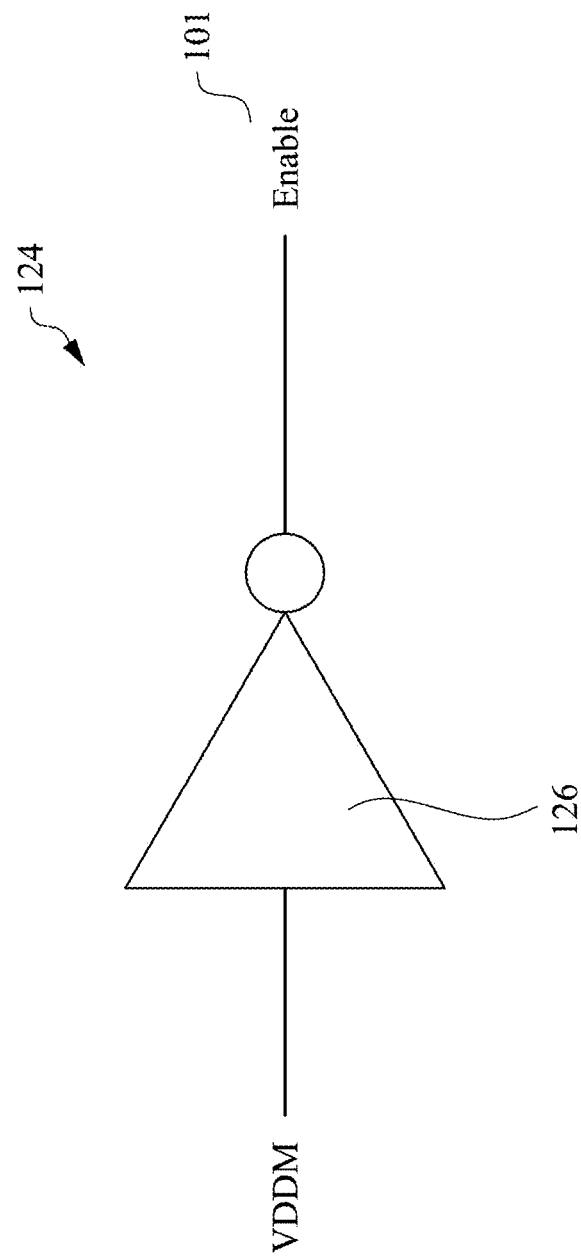
FIG. 10 is a schematic diagram illustrating another example of an enable circuit in accordance with some embodiments.

FIG. 10 illustrates an example of an enable circuit 124 configured to output the enable signal 101 to indicate collapse of the VDDM signal for the control circuit 100b. The control circuit 100b is configured to turn on the VDDM control switch 110 in response to a collapse of the VDDM voltage signal. As with the example of FIG. 5, the switches 110 and 112 in the circuit of FIG. 9 are PMOS transistors, which are turned on based on an active low signal at their gate terminals. Thus, in the enable circuit 124 shown in FIG. 10, an inverter 126 has its input terminal connected to the VDDM voltage terminal. When the VDDM signal collapses (i.e. decreases to 0 or logic low) the inverter 126 outputs a high enable signal 101.

Similarly to the control circuit 100a shown in FIG. 5, the control circuit 100b of FIG. 9 includes the first input terminal 130 configured to receive the shutdown signal SD, and the second input terminal 132 configured to receive the SRAM select signal AON_SELSRM_IN. The control circuit 100b further includes the first level shifter 134 and the second level shifter 136 that receive the shutdown signal SD and the SRAM select signal AON_SELSRAM_IN, respectively. The output of the first level shifter 134 is connected to the inverter 140, which outputs the shutdown bar signal SDB.

In the example of FIG. 9, the level shifted SRAM select signal AON_SELSRAM_IN is output to inverters 162 and 164. The output of the inverter 162 is received by a further inverter 166. The outputs of the inverters 166 and 164 are respectively received by NAND gates 168 and 170, along with the shutdown bar signal SDB. The output of the NAND gate 170 is received by an inverter 174 connected to another inverter 176, then the inverter 176 outputs the control signal GDB that is received at the gate terminal of the VDD control switch 110. An inverter 172 receives the output of the NAND gate 168, and provides an input signal to a NOR gate 178. The NOR gate 178 also receives the enable signal 101, and outputs the control signal GMB to the VDDM control switch 112. As with the example of FIG. 5, the inverters shown in FIG. 9 provide the desired signal timing and accordingly, more or fewer inverters may be employed to achieve proper timing of the signal outputs.

FIG. 11 is a table illustrating logic values for the signals corresponding to the circuit of FIG. 9. When the shutdown signal SD goes high to signal the shutdown mode, the inverter 140 outputs a low shut down bar SDB signal. The low SDB signal results in high outputs from the NAND gates 168 and 170. The high output of the NAND gate 170 results in a high GDB signal, which turns off the VDD control switch 110 and disconnects the VDD input terminal from the SRAM core 30 during the shutdown mode.

The high output of the NAND gate 168 is output to the inverter 172, which provides a low input to the NOR gate 178. Prior to collapse of the VDDM signal, the enable signal 101 remains low. Thus, prior to collapse of the VDDM signal, the NOR gate 178 outputs a high GMB control signal to the VDDM control switch 112, turning the VDDM control switch 112 off to disconnect the VDDM input terminal from the SRAM core 30 during the shutdown mode.

When the VDDM signal collapses (i.e. reduces to 0), the inverter 126 of the enable circuit 124 outputs a high enable signal 101. The high enable signal 101 received by the NOR gate 178 causes the GMB control signal to go low. This turns on the VDDM control switch 112, reducing the bulk to source leakage resulting from collapse of the VDDM signal.

Figure 12:
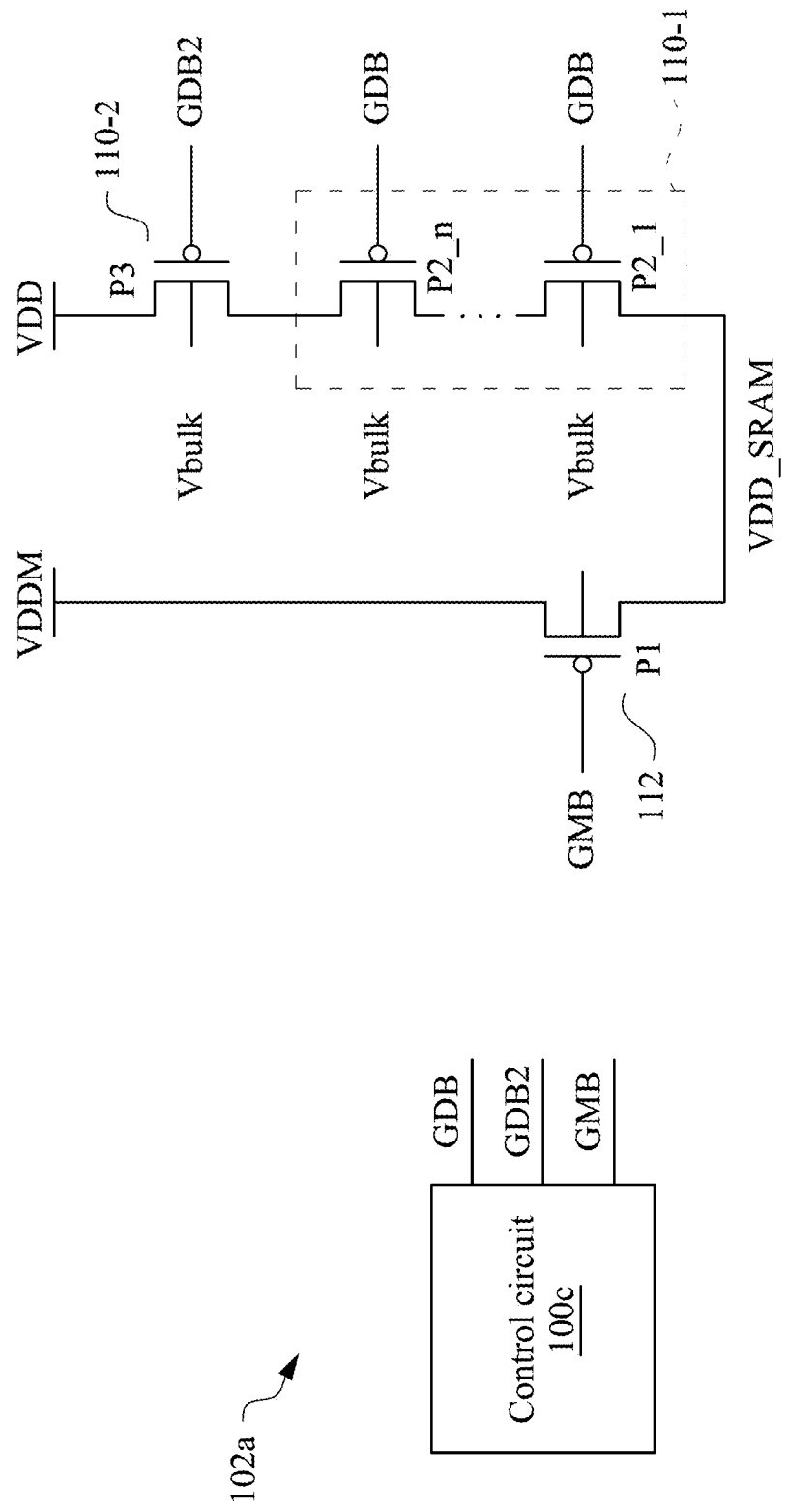
FIG. 12 is a schematic diagram illustrating another example of a header circuit and control circuit in accordance with some embodiments.
Figure 13:
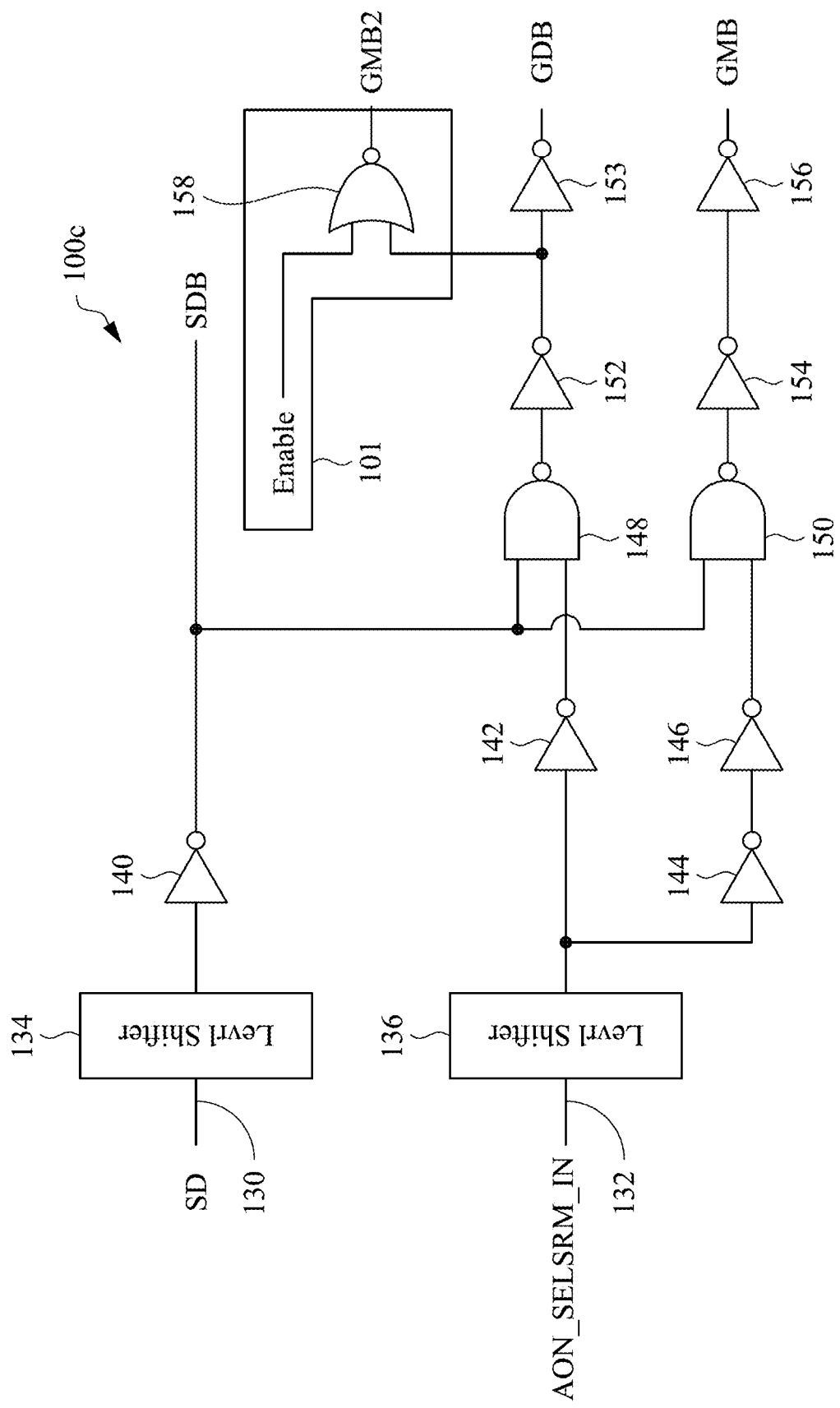
FIG. 13 is a schematic diagram illustrating a further example of a power switch control circuit in accordance with some embodiments.

FIG. 12 and FIG. 13 illustrate another example of the control circuit 100 and header circuit 102 of FIG. 1. More specifically, FIG. 12 illustrates an embodiment of a header circuit 102a in which a "stack" of VDD control switches are employed. One or more first VDD control switches 110-1 are connected in series with a second VDD control switch 110-2. In the example of FIG. 12, the first VDD control switches 110-1 include one or more PMOS switches P2_1 to P2_n, which have their source/drain terminals connected such that the switches 110-1 are connected in series with the second VDD control switch 110-2. The first VDD control switch(es) 110-1 are controlled by the GDB control signal, while the second VDD control switch 110-2 is controlled by a GDB2 control signal output by the control circuit 100c.

FIG. 13 illustrates aspects of the control circuit 100c. The control circuit 100c receives the enable signal 101 that is responsive to collapse of the VDD terminal. Therefore, the enable circuit 120 shown in FIG. 6 may provide the enable signal 101 for the control circuit 100c. The control circuit 100c outputs the GMB gate control signal to the gate terminal of the VDDM control switch 112, as well as the GDB and GDB2 control signals to the first and second VDD control switches 110-1 and 110-2, respectively. The GDB2 control signal is configured to selectively turn on the second VDD control switch 110-2 in response to a collapse, or decrease, of the voltage level of the VDD voltage signal reduce the bulk to source leakage of the second VDD control switch 110-2.

The control circuit 100c of FIG. 13 is similar to the control circuit 100a shown in FIG. 5, but is further configured to output the GDB2 signal. Thus, the control circuit 100c includes the first input terminal 130 that receives the shutdown signal SD and the second input terminal 132 that receives the SRAM select signal AON_SELSRM_IN. The first level shifter 134 and the second level shifter 136 receive the shutdown signal SD and the SRAM select signal AON_SELSRAM_IN, respectively. The inverter 140 outputs the inverted shutdown signal SD as the shutdown bar signal SDB. The level shifted SRAM select signal is output to inverters 142 and 144, and the output of the inverter 144 is received by the inverter 146.

The outputs of the inverters 142 and 146 are respectively received by the NAND gates 148 and 150, along with the shutdown bar signal SDB. The output of the NAND gate 150 is received by the inverters 154 and 156 to output the GMB control signal that is received at the gate terminal of the VDDM control switch 112. The inverter 152 receives the output of the NAND gate 148, and provides an input signal to the NOR gate 158. Additionally, an inverter 153 is connected to receive the output of the inverter 152. The inverter 153 outputs the GDB control signal to the first VDD control switch(es) 110-1.

As shown in the table of FIG. 14, the GDB control signal remains high prior to collapse of the VDD signal (i.e. shutdown mode), and also after collapse of the VDD signal (i.e. X-rail reduction mode). In other words, the control circuit 100c provides the GDB control signal to the first VDD control switch(es) 110-1 such that these switches remain off during the shutdown mode.

As with the control circuit 100a of FIG. 5, the NOR gate 158 in FIG. 13 receives the enable signal 101 in addition to the output of the inverter 152, and outputs the control signal GDB2 to the second VDD control switch 110-2. As shown in the table of FIG. 14, when the shutdown signal SD goes high to signal the shutdown mode, the inverter 140 outputs a low shut down bar SDB signal. The low SDB signal results in high outputs from the NAND gates 148 and 150. The high output of the NAND gate 150 results in a high GMB signal, turning off the VDDM control switch 112 and disconnecting the VDDM input terminal from the SRAM core 30 during the shutdown mode.

The high output of the NAND gate 148 is output to the inverter 152, the output of which is received by the inverter 153 to output the high GDB signal to the first VDD control switch(es) 110-1. The low output of the inverter 152 is further provided to the NOR gate 158. Prior to collapse of the VDD signal, the enable signal 101 remains low and the NOR gate 158 accordingly outputs a high GDB2 control signal to the second VDD control switch 110-2 disconnecting the VDD input terminal from the SRAM core 30 during the shutdown mode.

When the VDD signal collapses (i.e. reduces to 0), the inverter 122 of the enable circuit 120 outputs a high enable signal 101, signaling the X-rail reduction mode. The high enable signal 101 received by the NOR gate 158 causes the GDB2 control signal to go low. This turns on the second VDD control switch 110-2, reducing the bulk to source leakage.

Figure 15:
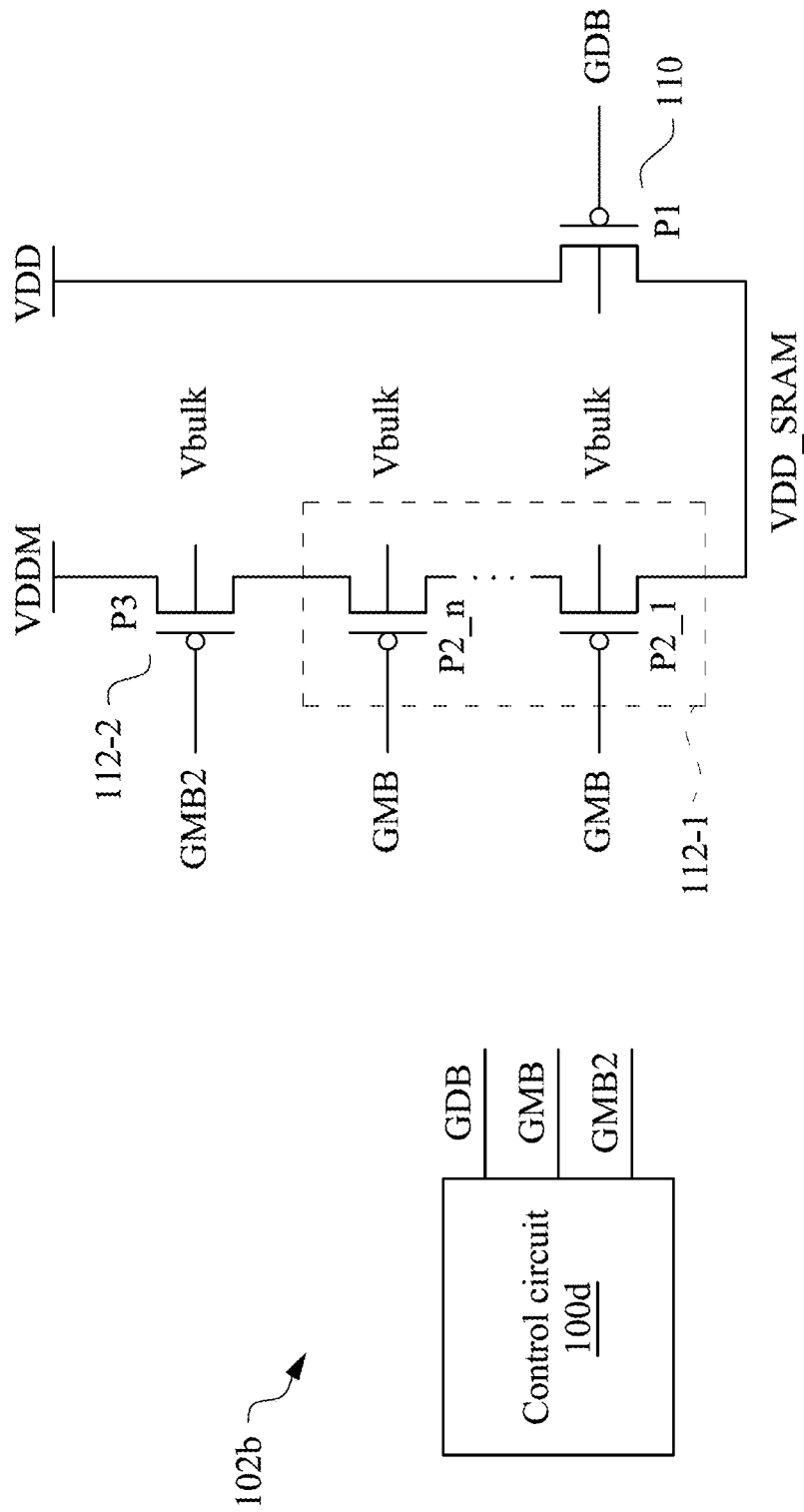
FIG. 15 is a schematic diagram illustrating another example of a header circuit and control circuit in accordance with some embodiments.
Figure 16:
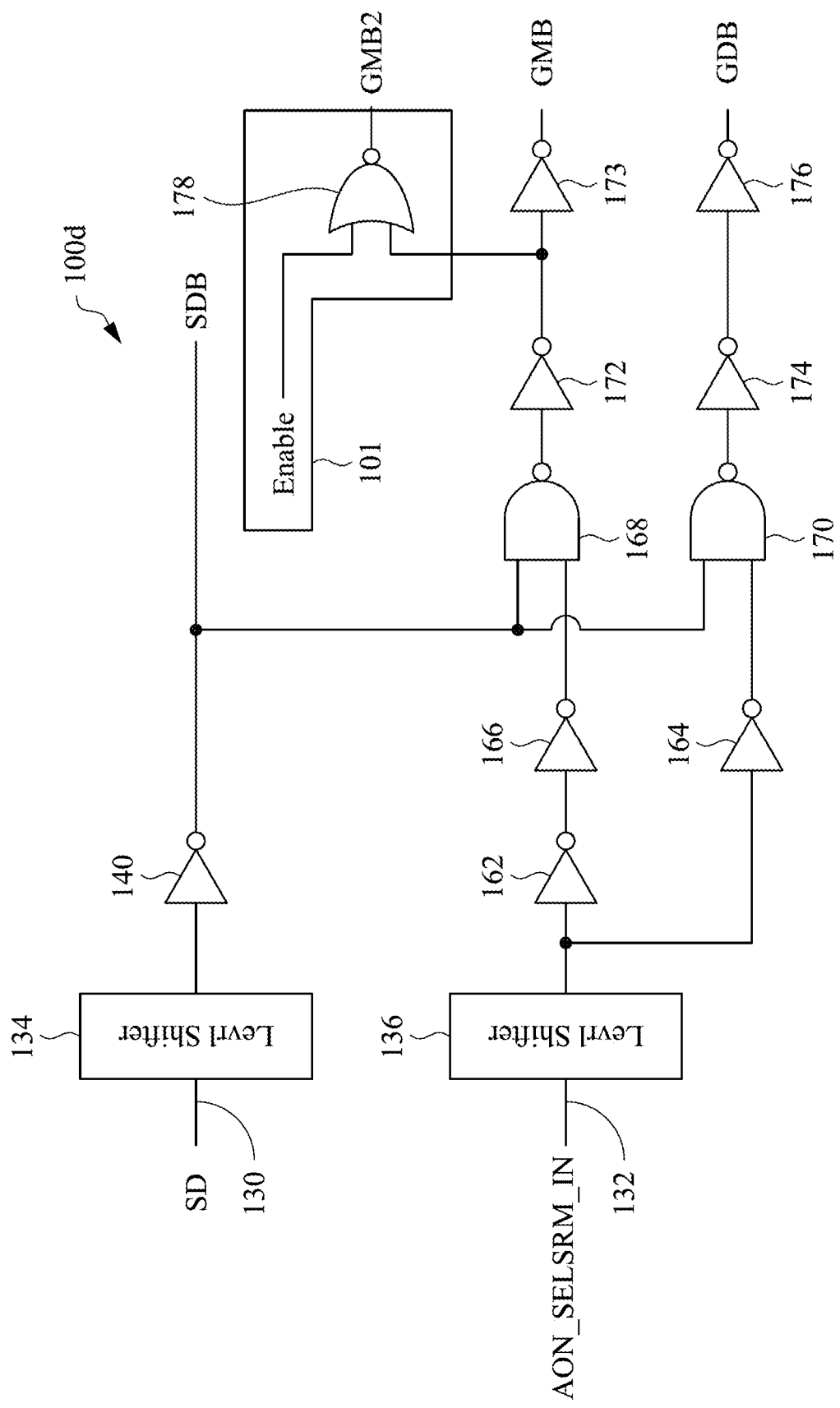
FIG. 16 is a schematic diagram illustrating another example of a power switch control circuit in accordance with some embodiments.

FIG. 15 and FIG. 16 illustrate yet another example of the control circuit 100 and header circuit 102 of FIG. 1. More specifically, FIG. 15 illustrates an embodiment of a header circuit 102b in which a stack of VDDM control switches are employed. One or more first VDDM control switches 112-1 have their source/drain terminals connected such that the switches 112-1 are connected in series with a second VDDM control switch 112-2. In FIG. 15, the first VDDM control switches 112-1 include one or more PMOS switches P2_1 to P2_n connected in series with the second VDDM control switch 112-2. The first VDDM control switch(es) 112-1 are controlled by the GMB control signal, while the second VDDM control switch 112-2 is controlled by a GMB2 control signal output by the control circuit 100d.

FIG. 16 illustrates aspects of the control circuit 100d. The control circuit 100d receives the enable signal 101 that is responsive to collapse of the VDDM terminal. Therefore, the enable circuit 124 shown in FIG. 10 may provide the enable signal 101 for the control circuit 100d. The control circuit 100d outputs the GDB gate control signal to the gate terminal of the VDD control switch 110, as well as the GMB and GMB2 control signals to the first and second VDDM control switches 112-1 and 112-2, respectively. The GMB2 control signal is configured to selectively turn on the second VDDM control switch 112-2 in response to a collapse, or decrease, of the voltage level of the VDDM voltage signal reduce the bulk to source leakage of the second VDDM control switch 112-2.

The control circuit 100d of FIG. 16 is similar to the control circuit 100b shown in FIG. 9, but is further configured to output the GMB2 signal in response to collapse of the VDDM voltage during the shutdown mode to turn on the second VDDM control switch 112-2 thereby reducing the bulk to source leakage.

The control circuit 100d has the first input terminal 130 that receives the shutdown signal SD, and the second input terminal 132 that receives the SRAM select signal AON_SELSRM_IN. The output of the first level shifter 134 is connected to the inverter 140, which outputs the shutdown bar signal SDB. The level shifted SRAM select signal AON_SELSRAM_IN is output to inverters 162 and 164, and the output of the inverter 162 is received by the inverter 166. The outputs of the inverters 166 and 164 are respectively received by the NAND gates 168 and 170, along with the shutdown bar signal SDB. The output of the NAND gate 170 is received by the inverter 174 and the inverter 176 outputs the control signal GDB that is received at the gate terminal of the VDD control switch 110.

The inverter 172 receives the output of the NAND gate 168, and provides an input signal to the NOR gate 178. Additionally, an inverter 173 is connected to receive the output of the inverter 172. The inverter 173 outputs the GMB control signal to the first VDDM control switch(es) 112-1.

As shown in the table of FIG. 17, the GMB control signal remains high prior to collapse of the VDDM signal (i.e. shutdown mode), and also after collapse of the VDDM signal (i.e. X-rail reduction mode). In other words, the control circuit 100d provides the GMB control signal to the first VDDM control switch(es) 112-1 such that these switches remain off during the shutdown mode and disconnect the SRAM core 30 from the VDDM terminal.

As with the control circuit 100b of FIG. 9, the NOR gate 178 in FIG. 16 receives the enable signal 101 in addition to the output of the inverter 172, and outputs the control signal GMB2 to the second VDDM control switch 112-2. As shown in the table of FIG. 17, when the shutdown signal SD goes high signaling the shutdown mode, the inverter 140 outputs a low shut down bar SDB signal. The low SDB signal results in high outputs from the NAND gates 168 and 170. The high output of the NAND gate 170 results in a high GDB signal, turning off the VDD control switch 110 and disconnecting the VDD input terminal from the SRAM core 30 during the shutdown mode.

The high output of the NAND gate 168 is output to the inverter 172, the output of which is received by the inverter 173 to output the high GMB signal to the first VDDM control switch(es) 112-1. The low output of the inverter 172 is further provided to the NOR gate 178. Prior to collapse of the VDDM signal, the enable signal 101 remains low and the NOR gate 178 accordingly outputs a high GMB2 control signal to the second VDDM control switch 112-2, disconnecting the VDDM input terminal from the SRAM core 30 during the shutdown mode.

When the VDDM signal collapses (i.e. reduces to 0), the inverter 126 of the enable circuit 124 outputs a high enable signal 101, signaling the X-rail reduction mode. The high enable signal 101 received by the NOR gate 178 causes the GMB2 control signal to go low. This turns on the second VDDM control switch 112-2, reducing the bulk to source leakage.

Figure 18:
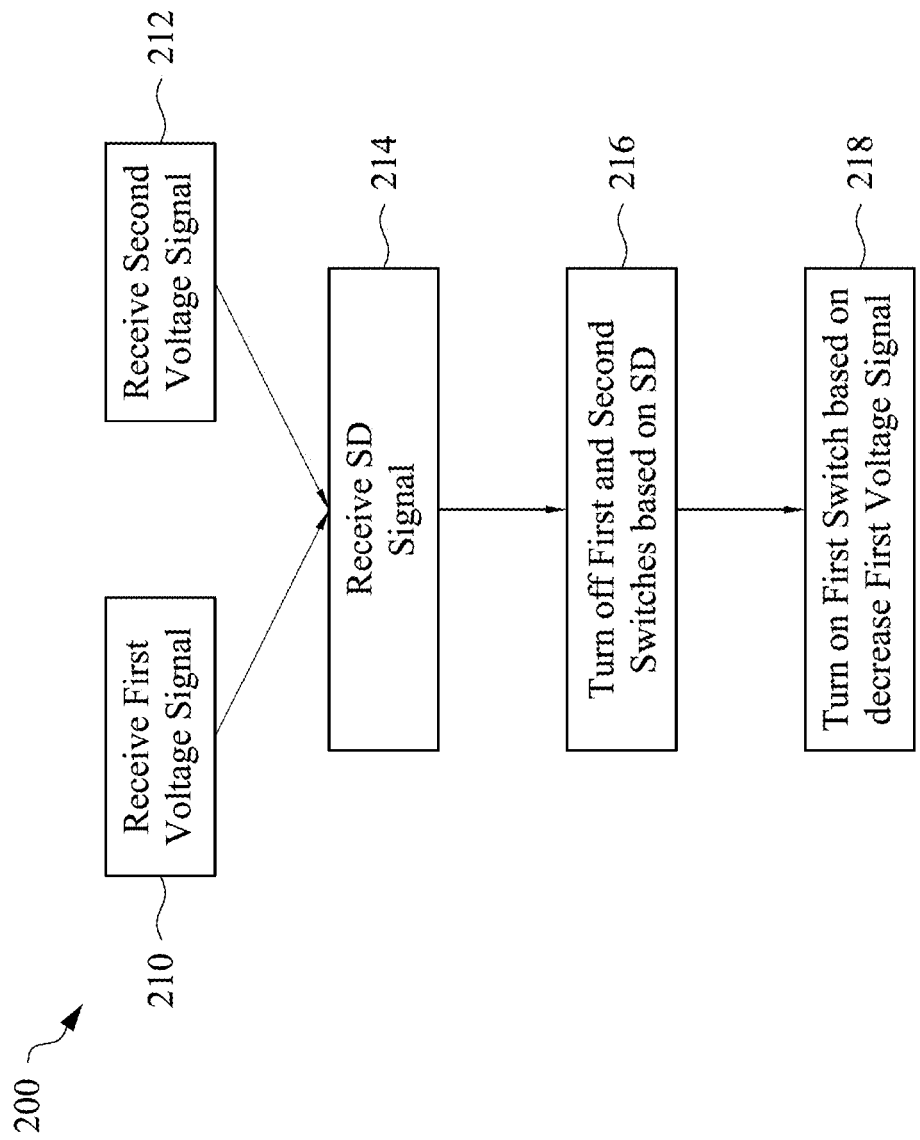
FIG. 18 is a flow diagram illustrating a method in accordance with some embodiments.

FIG. 18 is a flow diagram illustrating an example of a method 200 for controlling a header circuit such as the various examples of the header circuit 102 discussed above. The method may be implemented by the embodiments of the control circuit 100 disclosed herein, and in some implementations, operates to reduce GIDL leakage of a control switch that may occur after collapse of an input voltage signal such as the VDD and/or VDDM input voltages. With reference to FIG. 18 together with FIG. 2, at operation 210, the method includes receiving a first voltage signal VDD in a first power domain by a first switch 110. At operation 212, a second voltage signal VDDM in a second power domain is received by a second switch 112. In some examples, the first switch 110 or second switch 112 is turned on based on the AON_SEL_IN signal to provide the voltage level for the desired voltage domain to the SRAM core 30. For example, the SRAM core 30 power source comes from the switch 112 (i.e. VDDM) when the AON_SEL_IN signal is at a high level, and the control circuit 100 outputs a high GDB control signal and a low GMB signal to the gate terminals of the switches 110 and 112, respectively.

A shutdown signal, such as the shutdown signal SD shown in FIGS. 5-17, is received at operation 214. The SD signal has a first logic level that indicates a shutdown mode, and a second logic level that indicates a memory mode. In the memory mode (e.g. second logic level of the SD signal), the control circuit 100 controls the header circuit 102 such that the first and/or second voltage signal VDD, VDDM is selectively output to the SRAM core 30 to apply a supply voltage in the desired VDD or VDDM voltage domains. At operation 216, the first switch and the second switch are turned off in response to the first logic level of the shutdown signal SD. In other words, in the shutdown mode, the header circuit 102 is controlled to remove power from the SRAM core 30. Thereafter at operation 218, the first switch is turned on in response to a decrease of the first voltage signal while in the shutdown mode. This reduces GIDL leakage of the first switch due to the collapse of the first voltage signal.

Thus, aspects of the present disclosure provide a power switch circuit that is configured to select between power rails for different power domains, such as VDD and VDDM. The control circuit includes power transistors are responsive to respective control signals for the VDDM and VDD domains such that a device, such as an SRAM memory, may operate in two different power domains.

A power switch control circuit thus outputs control signals to a header circuit that controls power switches to selectively output power signals. In a shutdown mode (i.e. for reducing power consumption) the control circuit outputs gate control signals to turn off power switches, disconnecting the device from the VDDM and VDD input terminals. To reduce GIDL leakage caused by collapse of the VDD and/or VDDM signals in the shutdown mode, the appropriate switch(es) are turned on in response to collapse of VDD or VDDM. The bulk to source leakage is thus reduced.

More particularly, in accordance with some disclosed embodiments, a power control device includes a first switch and a second switch. A first terminal of the first switch is configured to receive a first voltage signal in a first voltage domain, and a first terminal of the second switch is configured to receive a second voltage signal in a second voltage domain different from the a first voltage domain. A second terminal of the second switch is coupled to a second terminal of the first switch, and a control circuit is coupled to control terminals of the first switch and the second switch. The control circuit is configured to turn on the first switch in response to a decrease of a voltage level of the first voltage signal.

In accordance with further aspects, a power control circuit includes a first voltage domain input terminal and a second voltage domain input terminal. A first transistor has a first source/drain terminal connected to the first voltage domain input terminal and a second source/drain terminal connected to a voltage output terminal. A second transistor has a first source/drain terminal connected to the second voltage domain input terminal and a second source/drain terminal connected to the voltage output terminal. A control circuit has an enable input terminal and an output terminal connected to gate terminals of the first and second transistors. An enable circuit includes an inverter having an input terminal connected to the first voltage domain input terminal, and an output connected to the enable input terminal.

In accordance with still further aspects, a power control method includes receiving a first voltage signal in a first power domain by a first switch, and receiving a second voltage signal in a second power domain by a second switch. A shutdown signal is received that has a first logic level that indicates a shutdown mode. The first switch and the second switch are turned off in response to the first logic level of the shutdown signal, and thereafter, the first switch is turned on in response to a decrease of the first voltage signal while in the shutdown mode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
   a first switch, a first terminal of the first switch configured to receive a first voltage signal in a first voltage domain;
   a second switch, a first terminal of the second switch configured to receive a second voltage signal in a second voltage domain different from the first voltage domain, a second terminal of the second switch coupled to a second terminal of the first switch;
   a control circuit coupled to control terminals of the first switch and the second switch, and configured to turn on the first switch in response to a decrease of a voltage level of the first voltage signal, wherein the control circuit includes an enable input terminal configured to receive an enable signal, and wherein the enable signal is based on the voltage level of the first voltage signal; and
   an enable circuit having an input terminal configured to receive the first voltage signal in the first voltage domain and an output terminal configured to output the enable signal to the enable input terminal.

2. The device of claim 1, wherein the first voltage domain is a VDD domain.

3. The device of claim 1, wherein the first voltage domain is a VDDM domain.

4. The device of claim 1, wherein the enable circuit includes an inverter.

5. The device of claim 1, wherein the first and second switches each comprise a PMOS transistor.

6. The device of claim 1, further comprising a plurality of first switches including the first switch, wherein the plurality of first switches are connected in series, and wherein the control circuit is configured to turn on at least one of the first switches in response to the decrease of the voltage level of the first voltage signal.

7. A circuit, comprising:
   a first voltage domain input terminal;
   a second voltage domain input terminal;
   a first transistor having a first source/drain terminal connected to the first voltage domain input terminal and a second source/drain terminal connected to a voltage output terminal;
   a second transistor having a first source/drain terminal connected to the second voltage domain input terminal and a second source/drain terminal connected to the voltage output terminal;
   a control circuit having an enable input terminal and an output terminal connected to gate terminals of the first and second transistors; and
   an enable circuit including an inverter having an input terminal connected to the first voltage domain input terminal, and an output connected to the enable input terminal.

8. The circuit of claim 7, wherein the control circuit is configured to turn on the first transistor in response to the enable signal indicating a decrease of a voltage signal received at the first voltage domain input terminal.

9. The circuit of claim 7, wherein the control circuit includes a shutdown terminal configured to receive a shutdown signal, and wherein the control circuit is further configured to turn off the first and second transistors based on the shutdown signal.

10. The circuit of claim 7, wherein a voltage level of the first voltage domain is lower than a voltage level of the second voltage domain.

11. The circuit of claim 7, wherein the first and second transistors each comprise a PMOS transistor.

12. The circuit of claim 7, further comprising a third transistor having a first source/drain terminal connected to the second source/drain terminal of the first transistor, and a second source/drain terminal connected to the voltage output terminal, wherein the control circuit has an output terminal connected to a gate terminal of the third transistor.

13. The circuit of claim 12, wherein the control circuit is configured to output first and second control signals to the gate terminals of the first and second transistors, respectively, in response to a shutdown signal, and to output a third control signal to the gate terminal of the third transistor in response to the shutdown signal and an enable signal output by the enable circuit.

14. The circuit of claim 7, wherein the voltage output terminal is connected to an SRAM memory array.

15. A method, comprising:
receiving a first voltage signal in a first power domain by a first terminal of a first switch;
receiving a second voltage signal in a second power domain by a first terminal of a second switch, wherein a second terminal of the second switch is coupled to a second terminal of the first switch;
receiving the first voltage signal in the first voltage domain by an input terminal of an enable circuit;
receiving an enable signal based on the voltage level of the first voltage signal from the enable circuit at an enable input terminal;
receiving a shutdown signal having a first logic level that indicates a shutdown mode;
turning off the first switch and the second switch in response to the first logic level of the shutdown signal; and thereafter
turning on the first switch in response to a decrease of the first voltage signal indicated by the enable signal while in the shutdown mode.

16. The method of claim 15, wherein the first power domain is one of a VDD power domain or a VDDM power domain.

17. The method of claim 15, wherein the shutdown signal has a second logic level that indicates a memory mode, and wherein the method further comprises turning on one of the first switch or the second switch to output a desired one of the first voltage signal or the second voltage signal in response to the second logic level of the shutdown signal.

18. The method of claim 15, further comprising:
generating the enable signal based on the decrease of the first voltage signal while in the shutdown mode; and
turning on the first switch in response to the enable signal.

19. The method of claim 15, wherein the enable circuit includes an inverter.

20. The method of claim 15, wherein the first and second switches each comprise a PMOS transistor.

* * * * *